(12) United States Patent
Chai

(10) Patent No.: US 12,148,485 B2
(45) Date of Patent: Nov. 19, 2024

(54) MEMORY DEVICE AND OPERATING METHOD OF THE MEMORY DEVICE INCLUDING DETECTING ERASE CELL DISTURBANCE DURING PROGRAMMING

(71) Applicant: SK hynix Inc., Icheon-si (KR)

(72) Inventor: Soo Yeol Chai, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 168 days.

(21) Appl. No.: 17/871,251

(22) Filed: Jul. 22, 2022

(65) Prior Publication Data

US 2023/0238065 A1 Jul. 27, 2023

(30) Foreign Application Priority Data

Jan. 24, 2022 (KR) ........................ 10-2022-0009937

(51) Int. Cl.
G11C 16/34 (2006.01)
G11C 16/10 (2006.01)
G11C 16/26 (2006.01)

(52) U.S. Cl.
CPC ........ *G11C 16/3459* (2013.01); *G11C 16/102* (2013.01); *G11C 16/26* (2013.01); *G11C 16/3404* (2013.01)

(58) Field of Classification Search
None
See application file for complete search history.

(56) References Cited

U.S. PATENT DOCUMENTS

| 6,567,312 | B1 * | 5/2003 | Torii | G11C 16/0491 |
| | | | | 365/185.28 |
| 10,832,778 | B1 * | 11/2020 | Yang | G11C 16/24 |
| 2007/0058446 | A1 * | 3/2007 | Hwang | G11C 16/3445 |
| | | | | 365/185.29 |
| 2007/0183208 | A1 * | 8/2007 | Tanaka | G11C 16/3418 |
| | | | | 365/185.24 |
| 2008/0291737 | A1 * | 11/2008 | Moon | G11C 16/3404 |
| | | | | 365/185.29 |

(Continued)

FOREIGN PATENT DOCUMENTS

| KR | 1020180081956 A | 7/2018 |
| KR | 1020210112190 A | 9/2021 |

*Primary Examiner* — J. H. Hur
(74) *Attorney, Agent, or Firm* — WILLIAM PARK & ASSOCIATES LTD.

(57) ABSTRACT

A memory device may include a plurality of memory cells, a peripheral circuit configured to perform a plurality of program loops on selected memory cells among the plurality of memory cells, each of the plurality of program loops including a program pulse application operation and a program verify operation, and control logic configured to control the peripheral circuit to suspend an $n^{th}$ program loop (n is a natural number equal to or greater than 1) among the plurality of program loops in response to a suspend command received during the $n^{th}$ program loop, and to resume the $n^{th}$ program loop with a negative verify operation in response to a resume command. The negative verify operation applies a negative voltage having a voltage less than a state voltage at the time of application of the resume command.

12 Claims, 10 Drawing Sheets

(56) References Cited

U.S. PATENT DOCUMENTS

| | | | |
|---|---|---|---|
| 2012/0044771 A1* | 2/2012 | Joo | G11C 16/3459 365/185.22 |
| 2018/0197610 A1* | 7/2018 | Lee | G11C 16/26 |
| 2021/0280262 A1* | 9/2021 | Jeong | G11C 16/26 |
| 2022/0230693 A1* | 7/2022 | Chai | G11C 16/32 |

* cited by examiner

MEMORY DEVICE AND OPERATING METHOD OF THE MEMORY DEVICE INCLUDING DETECTING ERASE CELL DISTURBANCE DURING PROGRAMMING

CROSS-REFERENCE TO RELATED APPLICATION

This application claims priority under 35 U.S.C. § 119 to Korean Patent Application No. 10-2022-0009937, filed on Jan. 24, 2022, which is incorporated herein by reference in its entirety.

BACKGROUND

1. Technical Field

Generally, embodiments relate to a semiconductor design technology, and more particularly, to a memory device and an operating method of the memory device.

2. Related Art

A storage device is a device that stores data under the control of a host device such as a computer and a smart phone. The storage device may include a memory device that stores data and a memory controller that controls the memory device. The memory device is classified into a volatile memory device and a nonvolatile memory device.

The volatile memory device is a memory device in which data is stored only when power is supplied and stored data is lost when the supply of power is cut off. Examples of the volatile memory device include a static random access memory (SRAM), a dynamic random access memory (DRAM), and the like.

The nonvolatile memory device is a memory device in which data is not lost even though power is cut off, and examples of the nonvolatile memory device include a read only memory (ROM), a programmable ROM (PROM), an electrically programmable ROM (EPROM), an electrically erasable and programmable ROM (EEPROM), a flash memory, and the like.

SUMMARY

A memory device in accordance with an embodiment of the present disclosure may include: a plurality of memory cells; a peripheral circuit configured to perform a plurality of program loops on selected memory cells among the plurality of memory cells, each of the plurality of program loops including a program pulse application operation and a program verify operation; and control logic configured to control the peripheral circuit to suspend an $n^{th}$ program bop (n is a natural number equal to or greater than 1) among the plurality of program loops in response to a suspend command received during the $n^{th}$ program loop, and to resume the $n^{th}$ program loop with a negative verify operation in response to a resume command, wherein the negative verify operation applies a negative voltage having a voltage less than a state voltage at the time of application of the resume command.

A memory device in accordance with another embodiment of the present disclosure may include: a plurality of memory cells; a peripheral circuit configured to perform a plurality of program loops on selected memory cells among the plurality of memory cells, each of the plurality of program loops including a program pulse application operation and a program verify operation; and control logic configured to control the peripheral circuit to suspend an $n^{th}$ program loop (n is a natural number equal to or greater than 1) among the plurality of program loops in response to a suspend command received during the $n^{th}$ program loop, and to resume the $n^{th}$ program loop with a negative verify operation after performing a recovery pulse application operation, in response to a resume command, wherein the negative verify operation applies a negative voltage having a voltage less than a state voltage at the time of application of the resume command.

An operating method of a memory device including a plurality of memory cells in accordance with another embodiment of the present disclosure may include: suspending an $n^{th}$ program loop (n is a natural number equal to or greater than 1) among a plurality of program loops for selected memory cells among the plurality of memory cells in response to a suspend command received during the $n^{th}$ program loop; and resuming the $n^{th}$ program loop with a negative verify operation in response to a resume command, wherein the negative verify operation applies a negative voltage having a voltage less than a state voltage at the time of application of the resume command.

DETAILED DESCRIPTION

Throughout the specification, when one element is referred to as being "connected to" another element, it includes that the former element is "directly connected to" the latter element or "electrically connected to" the latter element with another circuit interposed therebetween. Furthermore, when a part "includes" or "comprises" a component, it means that the part does not exclude another component but may further include or comprise another component, unless otherwise stated. Furthermore, although components described in the specification are represented in the form of a singular form, the present disclosure is not limited thereto, but the corresponding components may also be represented in the form of a plural form.

Various embodiments are directed to providing a memory device having improved program performance and an operating method thereof.

Technical problems to be achieved in the present disclosure are not limited to the aforementioned technical problems and the other unmentioned technical problems will be clearly understood by those skilled in the art from the following description.

A memory device and an operating method thereof in accordance with embodiments of the present disclosure may provide improved program performance.

Furthermore, in some embodiments, it is possible to solve a data reliability problem that may occur between suspend and resume.

Figure 1:
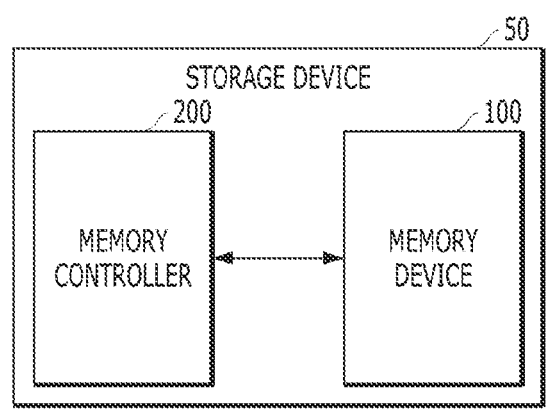
FIG. 1 is a diagram for explaining a storage device in accordance with an embodiment of the present disclosure.

FIG. 1 is a diagram for explaining a storage device 50 in accordance with an embodiment of the present disclosure.

Referring to FIG. 1, the storage device 50 may include a memory device 100 and a memory controller 200 that controls an operation of the memory device 100. The storage device 50 is a device that stores data under the control of a host such as a mobile phone, a smart phone, an MP3 player, a laptop computer, a desktop computer, a game machine, a television, a tablet PC, or an in-vehicle infotainment system.

The storage device 50 may be fabricated as any one of various types of storage devices according to a host interface that is a communication method with the host. For example, the storage device 50 may be configured as any one of various types of storage devices such as a multimedia card in the form of an SSD, an MMC, an eM MC, an RS-MMC, or a micro-MMC, a secure digital card in the form of an SD, a mini-SD, or a micro-SD, a universal serial bus (USB) storage device, a universal flash storage (UFS) device, a storage device in the form of a personal computer memory card international association (PCMCIA) card, a storage device in the form of a peripheral component interconnection (PCI) card, a storage device in the form of a PCI express (PCI-E) card, a compact flash (CF) card, a smart media card, and a memory stick.

The storage device 50 may be fabricated as any one of various types of packages. For example, the storage device 50 may be fabricated as any one of various types of packages such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells for storing data.

Each of the memory cells may be configured as a single level cell (SLC) that stores one data bit, a multilevel cell (MLC) that stores two data bits, a triple level cell (TLC) that may store three data bits, or a quad level cell (QLC) that stores four data bits.

The memory cell array may include a plurality of memory blocks. Each of the memory blocks may include a plurality of memory cells. One memory block may include a plurality of pages. In an embodiment, the page may be a unit for storing data in the memory device 100 or reading data stored in the memory device 100.

The memory block may be a unit for erasing data. In an embodiment, examples of the memory device 100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), and the like. In the present specification, for convenience of description, it is assumed that the memory device 100 is a NAND flash memory.

The memory device 100 is configured to receive a command and an address from the memory controller 200, and to access a region of the memory cell array selected by an address. That is, the memory device 100 may perform an operation indicated by a command on the region selected by the address. For example, the memory device 100 may perform a write operation (program operation), a read operation, and an erase operation. During the program operation, the memory device 100 may program data in the region selected by the address. During the read operation, the memory device 100 may read data from the region selected by the address. During the erase operation, the memory device 100 may erase data stored in the region selected by the address.

In an embodiment, the memory device 100 may perform a program operation including at least one program loop in response to a program command received from the memory controller 200. One program loop may include a program pulse application operation and a program verify operation.

The memory device 100 may suspend a program loop being executed, in response to a suspend command Suspend Command received from the memory controller 200.

The memory device 100 may perform a read operation while a program loop is being suspended.

In an embodiment, the memory device 100 may perform a read operation while a program loop is being suspended, in response to a suspend command. Specifically, when a read command is received while the program loop is being executed, the read command may serve as a suspend command, and the memory device 100 may perform the read operation after the program loop is suspended.

In another embodiment, the memory device 100 may perform a read operation while a program loop is being suspended, in response to a read command received from the memory controller 200 after a suspend command. Specifically, when a suspend command is received while a program loop is being executed, the memory device 100 may suspend the program loop. Thereafter, the memory device 100 may perform the read operation in response to a separate read command received from the memory controller 200.

The memory device 100 may resume the suspended program loop in response to a resume command received from the memory controller 200. After performing a recovery pulse application operation, the memory device 100 may resume the program loop in response to the resume command. The recovery pulse application operation may be an operation for compensating for detrapped charges while the program loop is being suspended in a channel region of memory cells selected for programming.

The recovery pulse application operation may be an operation for applying at least one recovery pulse to a selected word line connected to the selected memory cells. The level of the recovery pulse may be variously set. In an embodiment, the level of the recovery pulse may be lower than that of a program pulse. The level of the recovery pulse may be higher than or equal to that of a pass voltage applied to an unselected word line. The level of the recovery pulse may increase as a count value of a suspended program loop increases.

In accordance with an embodiment of the present disclosure, the memory device 100 may perform a recovery pulse application operation in response to a resume command and then resume a program loop, thereby compensating for charges detrapped in a channel region of selected memory cells and improving deterioration in a threshold voltage distribution.

The memory controller 200 controls the overall operation of the storage device 50.

When the storage device 50 is powered on, the memory controller 200 may execute firmware (FW). When the memory device 100 is a flash memory device, the memory controller 200 may execute firmware such as a flash translation layer (FTL) for controlling communication between the host and the memory device 100.

In an embodiment, the memory controller 200 may receive data and a logical block address (LBA) from the host, and translate the logical block address into a physical block address (PBA) indicating an address of memory cells where data included in the memory device 100 is to be stored.

The memory controller 200 may control the memory device 100 to perform a program operation, a read operation, an erase operation, or the like at a request of the host. During the program operation, the memory controller 200 may provide a write command, a physical block address, and data to the memory device 100. During the read operation, the memory controller 200 may provide a read command and a physical block address to the memory device 100. During the erase operation, the memory controller 200 may provide an erase command and a physical block address to the memory device 100.

In an embodiment, the memory controller 200 may generate commands, addresses, and data by itself regardless of a request from the host, and transmit the generated commands, addresses, and data to the memory device 100. For example, the memory controller 200 may provide commands, addresses, and data to the memory device 100 in order to perform background operations such as a program operation for wear leveling and a program operation for garbage collection.

In an embodiment, the memory controller 200 may control at least two memory devices 100. In such a case, the memory controller 200 may control the memory devices 100 according to an interleaving method in order to improve operation performance. The interleaving method may be an operation method for overlapping operation sections of at least two memory devices 100.

The host may communicate with the storage device 50 by using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a non-volatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
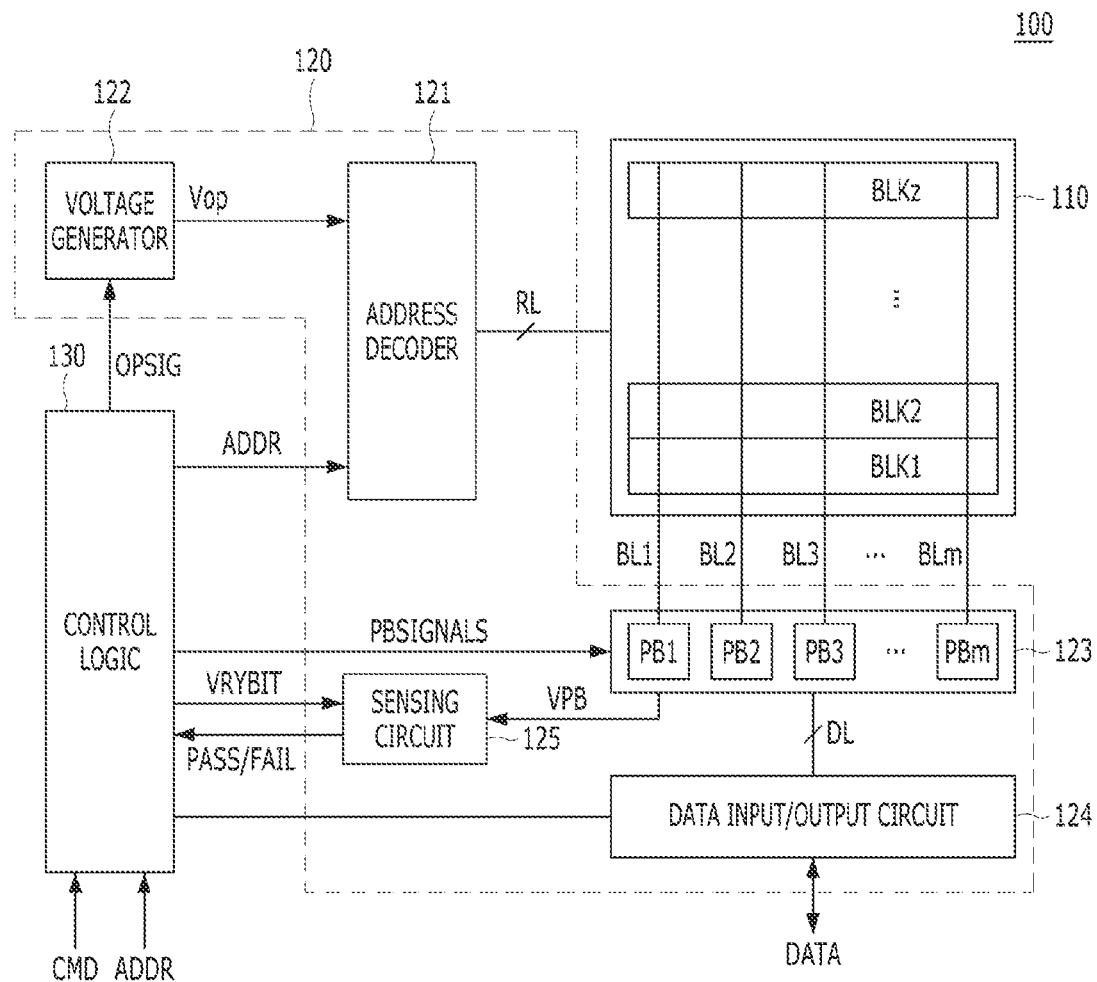
FIG. 2 is a diagram for explaining the structure of a memory device in FIG. 1.

FIG. 2 is a diagram for explaining the structure of the memory device 100 in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. In an embodiment, the plurality of memory cells are nonvolatile memory cells. Memory cells connected to substantially the same word line among the plurality of memory cells are defined as one physical page. That is, the memory cell array 110 includes a plurality of physical pages. In accordance with an embodiment of the present disclosure, each of the plurality of memory blocks BLK1 to BLKz included in the memory cell array 110 includes a plurality of dummy cells. One or more dummy cells may be connected in series between a drain select transistor and memory cells and between a source select transistor and memory cells.

Each of the memory cells of the memory device 100 may be configured as a single level cell (SLC) that stores one data bit, a multilevel cell (MLC) that stores two data bits, a triple level cell (TLC) that stores three data bits, or a quad level cell (QLC) that may store four data bits.

The peripheral circuit 120 may include the address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 so that a program operation, a read operation, and an erase operation are performed.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 is configured to operate in response to control of the control logic 130. The address decoder 121 receives addresses ADDR from the control logic 130.

The address decoder 121 is configured to decode a block address among the received addresses ADDR. The address decoder 121 selects at least one of the memory blocks BLK1 to BLKz according to the decoded block address. The address decoder 121 is configured to decode a row address among the received addresses ADDR. The address decoder 121 may select at least one of word lines of a selected memory block according to the decoded row address. The address decoder 121 may apply an operating voltage flop supplied from the voltage generator 122 to the selected word line.

During a program operation, the address decoder 121 may apply a program voltage to a selected word line and apply a pass voltage having a lower level than the program voltage to unselected word lines. During a program verify operation, the address decoder 121 may apply a verify voltage to a selected word line and apply a verify pass voltage having a higher level than the verify voltage to unselected word lines.

During a read operation, the address decoder 121 may apply a read voltage to a selected word line and apply a read pass voltage having a higher level than the read voltage to unselected word lines.

In accordance with an embodiment of the present disclosure, an erase operation of the memory device 100 is performed in units of memory blocks. The addresses ADDR input to the memory device 100 during the erase operation include a block address. The address decoder 121 may decode the block address, and select at least one memory block according to the decoded block address. During the erase operation, the address decoder 121 may apply a ground voltage to word lines input to the selected memory block.

In accordance with an embodiment of the present disclosure, the address decoder 121 may be configured to decode a column address among the transferred addresses ADDR. The decoded column address may be transferred to the read and write circuit 123. For example, the address decoder 121 may include components such as a row decoder, a column decoder, and an address buffer.

The voltage generator 122 is configured to generate a plurality of operating voltages Vop by using an external power supply voltage supplied to the memory device 100. The voltage generator 122 operates in response to control of the control logic 130.

In an embodiment, the voltage generator 122 may generate an internal power supply voltage by regulating the external power supply voltage. The internal power supply voltage generated by the voltage generator 122 is used as an operating voltage of the memory device 100.

In an embodiment, the voltage generator 122 may generate the plurality of operating voltages Vop by using the external power supply voltage or the internal power supply voltage. The voltage generator 122 may be configured to generate various voltages required for the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors configured to receive the internal power supply voltage in order to generate the plurality of operating voltages Vop having various voltage levels, and generate the plurality of operating voltages Vop by selectively activating the plurality of pumping capacitors in response to control of the control logic 130.

The plurality of generated operating voltages Vop may be supplied to the memory cell array 110 by the address decoder 121.

The read and write circuit 123 includes first to $m^{th}$ page buffers PB1 to PBm. The first to $m^{th}$ page buffers PB1 to PBm are connected to the memory cell array 110 through the first to $m^{th}$ bit lines BL1 to BLm. The first to $m^{th}$ page buffers PB1 to PBm operate in response to control of the control logic 130.

The first to $m^{th}$ page buffers PB1 to PBm communicate data DATA with the data input/output circuit 124. During programming, the first to $m^{th}$ page buffers PB1 to PBm receive the data DATA to be stored through the data input/output circuit 124 and data lines DL.

During a program operation, when a program voltage is applied to a selected word line, the first to $m^{th}$ page buffers PB1 to PBm may transfer the data DATA to be stored, which is received through the data input/output circuit 124, to selected memory cells through the bit lines BL1 to BLm. Memory cells of a selected page are programmed according to the transferred data DATA. A memory cell connected to a bit line to which a program enable voltage (for example, a ground voltage) is applied may have an increased threshold voltage. A threshold voltage of a memory cell connected to a bit line to which a program inhibit voltage (for example, a power supply voltage) is applied may be substantially maintained. During a program verify operation, the first to $m^{th}$ page buffers PB1 to PBm read the data DATA stored in memory cells from selected memory cells through the bit lines BL1 to BLm.

During a read operation, the read and write circuit 123 may read the data DATA from memory cells of a selected page through the bit lines BL, and store the read data DATA in the first to $m^{th}$ page buffers PB1 to PBm.

During an erase operation, the read and write circuit 123 may float the bit lines BL. In an embodiment, the read and write circuit 123 may include a column selection circuit.

The data input/output circuit 124 is connected to the first to $m^{th}$ page buffers PB1 to PBm through the data lines DL. The data input/output circuit 124 operates in response to control of the control logic 130.

The data input/output circuit 124 may include a plurality of input/output buffers (not illustrated) configured to receive input data DATA. During a program operation, the data input/output circuit 124 receives data DATA to be stored from an external controller (not illustrated). During a read operation, the data input/output circuit 124 outputs, to the external controller, the data DATA transferred from the first to $m^{th}$ page buffers PB1 to PBm included in the read and write circuit 123.

The sensing circuit 125 may generate a reference current in response to an enable bit VRYBIT signal generated by the control logic 130 during a read operation or a verify operation, compare a sensing voltage VPB received from the read and write circuit 123 with a reference voltage generated by the reference current, and output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control the overall operation of the memory device 100. The control logic 130 may operate in response to commands CMD transferred from an external device.

The control logic 130 may generate various signals in response to the commands CMD and the addresses ADDR, and control the peripheral circuit 120. For example, the control logic 130 may generate an operation signal OPSIG, an address ADDR, read and write circuit control signals PBSIGNALS, and the enable bit VRYBIT in response to the commands CMD and the addresses ADDR. The control logic 130 may output the operation signal OPSIG to the voltage generator 122, output the address ADDR to the address decoder 121, output the read and write circuit control signals PBSIGNALS to the read and write circuit 123, and output the enable bit VRYBIT to the sensing circuit 125. Furthermore, the control logic 130 may determine whether a verify operation has passed or failed, in response to a pass or fail signal PASS/FAIL output by the sensing circuit 125.

In an embodiment, the control logic 130 may control the peripheral circuit 120 to perform a program operation on selected memory cells of the memory cell array 110 in response to a program command. The program operation may include at least one program loop. Each program loop may include a program pulse application operation and a program verify operation. This will be described below with reference to FIG. 4.

The control logic 130 may control the peripheral circuit 120 to suspend a program loop being executed in response to a received suspend command.

More specifically, the control logic 130 may receive the suspend command during the program pulse application operation of the program loop. The control logic 130 may control the peripheral circuit 120 to complete the program pulse application operation of the program loop, in response to the suspend command. When the program pulse application operation is completed, the control logic 130 may control the peripheral circuit 120 to suspend the program loop. The suspend of the program loop executed when the control logic 130 receives the suspend command during the program pulse application operation will be described below with reference to FIG. 7.

In an embodiment, the control logic 130 may control the peripheral circuit 120 to perform a read operation after the program loop is suspended, in response to a suspend command. In such a case, the suspend command may be a read command received during the program loop. Details thereof will be described below with reference to FIG. 5.

In an embodiment, the control logic 130 may control the peripheral circuit 120 to perform a read operation after the program loop is suspended, in response to a read command. In such a case, the read command may be a command received after the suspend command. Details thereof will be described below with reference to FIG. 6.

The control logic 130 may control the peripheral circuit 120 to resume the suspended program loop in response to a received resume command.

More specifically, when the program loop is suspended after the program pulse application operation is completed, the control logic 130 may control the peripheral circuit 120 to resume a program verify operation of the suspended program loop in response to the resume command. In various embodiments, the control logic 130 may control the peripheral circuit 120 to resume a program verify operation after performing a recovery pulse application operation, in response to the resume command. Resume of the program loop will be described below with reference to FIG. 7 to FIG. 9.

Charges trapped in the channel region of memory cells selected for programming may be detrapped while the program loop is being suspended. The recovery pulse application operation may be an operation for compensating for charges detrapped in the channel region of the selected memory cells. The recovery pulse application operation may be an operation for applying at least one recovery pulse to a selected word line connected to the selected memory cells.

The level of the recovery pulse may be variously set. In an embodiment, the level of the recovery pulse may be lower than that of a program pulse. The level of the recovery pulse may be higher than or equal to that of a pass voltage applied to an unselected word line. The level of the recovery pulse may increase as a count value of a suspended program loop increases.

Figure 3:
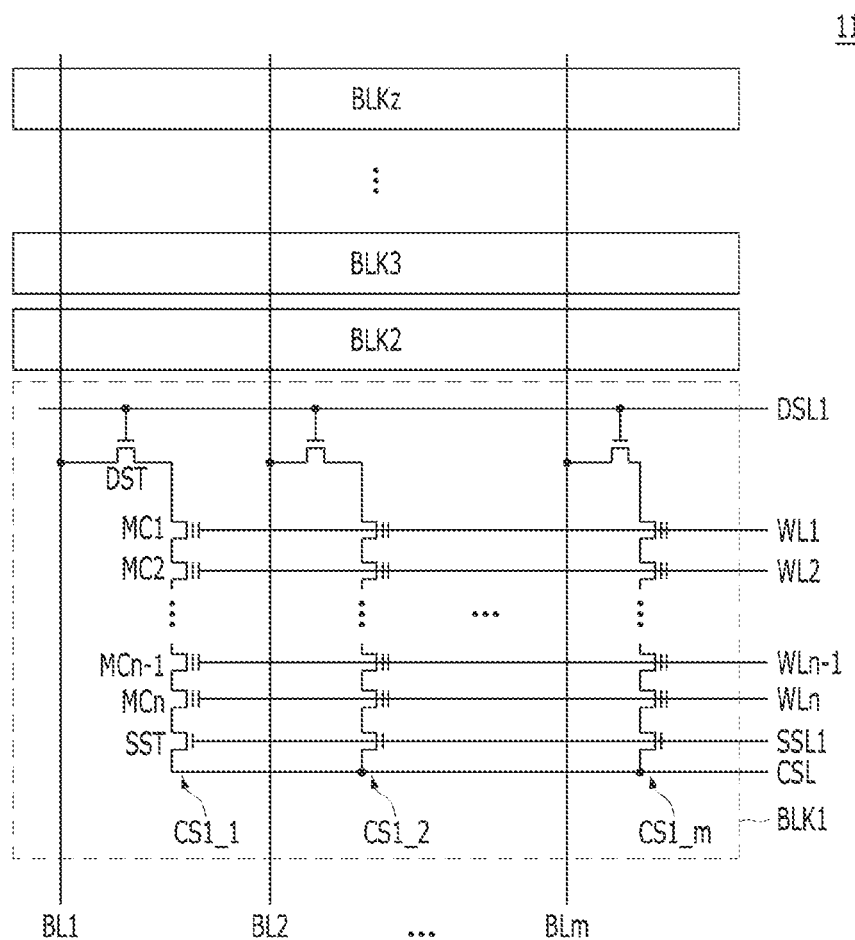
FIG. 3 is a diagram for explaining a memory cell array in FIG. 2.

FIG. 3 is a diagram for explaining the memory cell array 110 in FIG. 2.

Referring to FIG. 3, first to $z^{th}$ memory blocks BLK1 to BLKz are connected in common to the first to $m^{th}$ bit lines BL1 to BLm. In FIG. 3, for convenience of description, elements included in the first memory block BLK1 among the plurality of memory blocks BLK1 to BLKz are illustrated and elements included in each of the other memory blocks BLK2 to BLKz are omitted. It can be understood that each of the other memory blocks BLK2 to BLKz is configured similarly to the first memory block BLK1.

The memory block BLK1 may include a plurality of cell strings CS1_1 to CS1_m (m is a positive integer). The first to $m^{th}$ cell strings CS1_1 to CS1_m are connected to the first to $m^{th}$ bit lines BL1 to BLm, respectively. Each of the first to $m^{th}$ cell strings CS1_1 to CS1_m includes a drain select transistor DST, a plurality of serially connected memory cells MC1 to MCn (n is a positive integer), and a source select transistor SST.

A gate terminal of the drain select transistor DST included in each of the first to $m^{th}$ cell strings CS1_1 to CS1_m is connected to a drain select line DSL1. Gate terminals of the first to $n^{th}$ memory cells MC1 to MCn included in each of the first to $m^{th}$ cell strings CS1_1 to CS1_m are connected to first to $n^{th}$ word lines WL1 to WLn, respectively. A gate terminal of the source select transistor SST included in each of the first to $m^{th}$ cell strings CS1_1 to CS1_m is connected to a source select line SSL1.

For convenience of description, the structure of a cell string will be described with reference to the first cell string CS1_1 among the plurality of cell strings CS1_1 to CS1_m. However, it can be understood that each of the other cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to $n^{th}$ memory cells MC1 to MCn are connected in series with one another. A drain terminal of the source select transistor SST included in the first cell string CS1_1 is connected to a source terminal of the $n^{th}$ memory cell MCn included in the first cell string CS1_1. A source terminal of the source select transistor SST included in the first cell string CS1_1 is connected to a common source line CSL. In an embodiment, the common source line CSL may be connected in common to the first to $z^{th}$ memory blocks BLK1 to BLKz.

The drain select line DSL1, the first to $n^{th}$ word lines WL1 to WLn, and the source select line SSL1 are included in the row lines RL in FIG. 2. The drain select line DSL1, the first to $n^{th}$ word lines WL1 to WLn, and the source select line SSL1 are controlled by the address decoder 121. The common source line CSL is controlled by the control logic 130. The first to $m^{th}$ bit lines BL1 to BLm are controlled by the read and write circuit 123.

Figure 4:
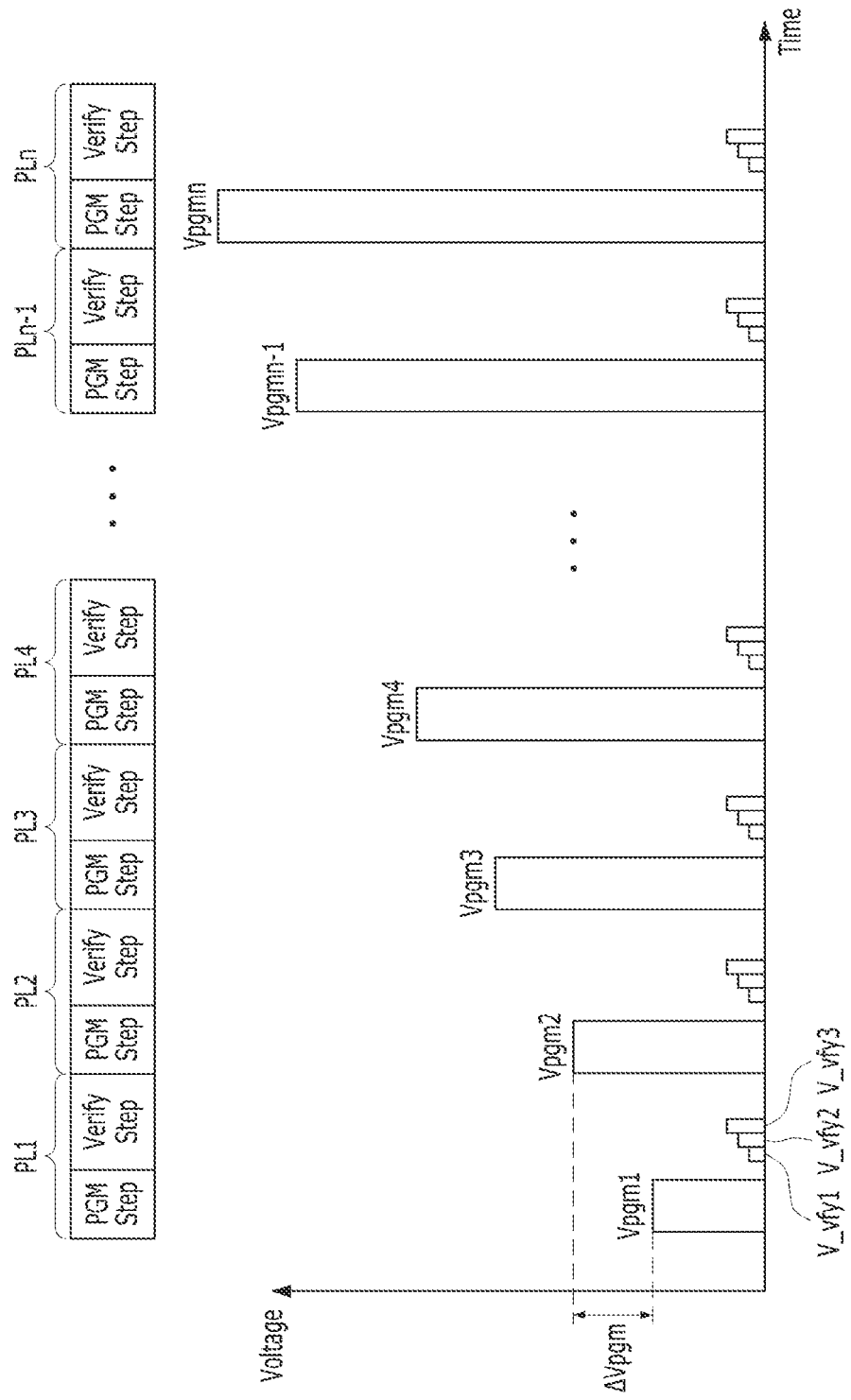
FIG. 4 is a diagram for explaining a program loop.

FIG. 4 is a diagram for explaining a program loop.

Referring to FIG. 4, the program operation may include a plurality of program loops PL1 to PLn (n is a natural number equal to or greater than 1). A memory device may execute a plurality of program loops so that selected memory cells are programmed to have a target state among a plurality of program states.

Each of the plurality of program loops may include a program voltage application step PGM Step and a verify step Verify Step.

In the program voltage application step, a program pulse application operation may be performed to apply a program voltage to a selected word line connected to selected memory cells. Each of memory cells selected by the program pulse application operation may be programmed to have a target state among a plurality of program states. The target state may be determined according to data to be programmed to the selected memory cells.

In the verify step, a program verify operation may be performed to determine whether the selected memory cells have been programmed by applying verify voltages to the selected word line. The program verify operation may include state verify operations corresponding to one or more target program states, respectively. The state verify operation may be an operation for determining whether the selected memory cells have been programmed to the target program states by applying verify voltages corresponding to the target program states to the selected word line.

In an embodiment, a program voltage may be determined according to an incremental step pulse programming (ISPP) method. That is, the level of the program voltage may be increased or decreased in a stepwise manner by a predetermined voltage increment as program loops are repeated. The number of times of application of program voltages used in each program loop, voltage levels, voltage application times, and the like may be determined in various forms under the control of the memory controller.

A pass voltage may be applied to unselected word lines that are remaining word lines other than the selected word line. In an embodiment, pass voltages having substantially the same level may be applied to the unselected word lines. In an embodiment, pass voltages may have different levels depending on the position of the word line.

A ground voltage may be applied as a program enable voltage to selected bit lines connected to memory cells to be programmed. A program inhibit voltage may be applied to unselected bit lines that are bit lines connected to memory cells other than the memory cells to be programmed.

In a program verify step, the memory device may apply a verify voltage to the selected word line and apply a verify pass voltage to the unselected word lines. The memory device may detect voltages or currents output through bit lines to which memory cells connected to the selected word line are respectively connected, and determine whether the verify step is pass or fail on the basis of the detected result.

In a program voltage application step, the selected memory cells may be programmed to any one of first to $m^{th}$ states (m is a natural number equal to or greater than 1).

In a verify step, a state verify operation may be performed on at least one program state of the first to $m^{th}$ states. For example, when memory cells to be programmed to a $k^{th}$ state (k is a natural number equal to or greater than 1 and equal to or less than m) among the selected memory cells are read as off-cells by a verify voltage corresponding to the $k^{th}$ state, the state verify operation for the $k^{th}$ state may be passed.

In FIG. 4, when the selected memory cells are multilevel cells (MLC) configured to store two data bits, the selected memory cells may be programmed to any one of an erase state and first to third program states. The number of data bits stored in the memory cell is not limited to the present embodiment.

When a first program loop PL1 is executed, first to third verify voltages V_vfy1 to V_vfy3 are sequentially applied in order to verify program states of a plurality of memory cells after a first program voltage Vpgm1 is applied. In such a case, memory cells having a target state that is the first program state may be verified by the first verify voltage V_vfy1, memory cells having a target state that is the second program state may be verified by the second verify voltage V_vfy2, and memory cells having a target state that is the third program state may be verified by the third verify voltage V_vfy3. The number of verify voltages is not limited to the present embodiment.

Memory cells verify-passed by the verify voltages V_vfy1 to V_vfy3 may be determined to have target states, and then may be program-inhibited (program inhibit) in a second program loop PL2. A program inhibit voltage may be applied to a bit line connected to the program-inhibited memory cells. A second program voltage Vpgm2, which is higher than the first program voltage Vpgm1 by a unit voltage ΔVpgm, is applied to a selected word line in the second program loop PL2.

Thereafter, a program verify operation is performed in substantially the same manner as the program verify operation of the first program loop PL1. For example, the verify pass indicates that a memory cell is read as an off-cell by a corresponding verify voltage.

As described above, when the memory device programs the multilevel cell (MLC), the memory device verifies respective memory cells, which have respective program states as target states, by using the first to third verify voltages V_vfy1 to V_vfy3.

In various embodiments, when a program operation is not completed within a preset number of program loops, the program operation may be determined to fail. When the program operation is completed within the preset number of program loops, the program operation may be determined to pass. Whether the program operation has been completed may be determined according to whether all program verify operations for selected memory cells have passed. When all the program verify operations are passed, a next program loop may not be executed.

Figure 5:
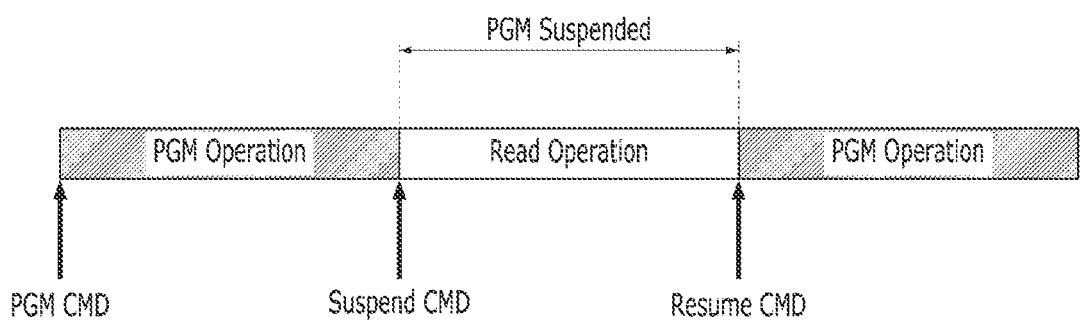
FIG. 5 is a diagram for explaining a suspend command in accordance with an embodiment.

FIG. 5 is a diagram for explaining a suspend command in accordance with an embodiment.

Referring to FIG. 5, the memory device 100 of FIG. 1 may perform a program operation in response to an input program command PGM CMD. When a read command is input while the program operation is being performed, the memory device 100 may suspend the program operation. The read command input during the program operation may serve as a suspend command Suspend CMD for suspending the program operation.

The memory device 100 may perform a read operation after suspending the program operation in response to the suspend command. When a resume command Resume CMD is input after completing the read operation, the memory device 100 may resume the suspended program operation.

Figure 6:
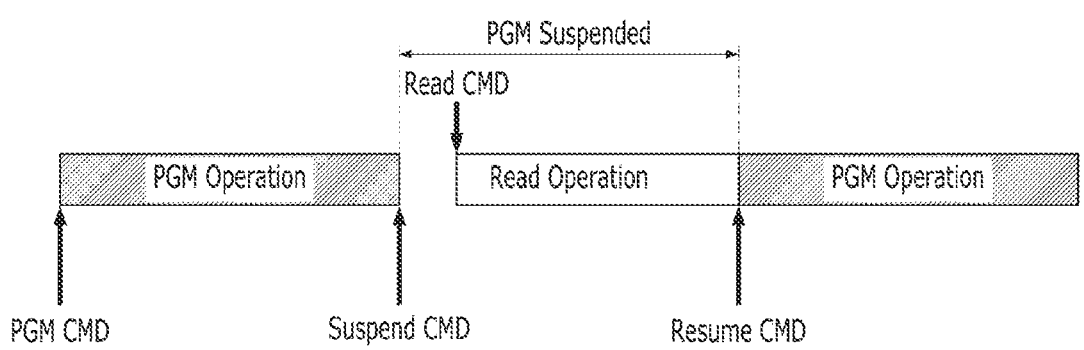
FIG. 6 is a diagram for explaining a suspend command in accordance with another embodiment.

FIG. 6 is a diagram for explaining a suspend command in accordance with another embodiment.

Referring to FIG. 6, the memory device 100 of FIG. 1 may perform a program operation in response to an input program command PGM CMD. When a suspend command is input while the program operation is being performed, the memory device 100 may suspend the program operation.

The memory device 100 may perform a read operation in response to an input read command after suspending the program operation. When a resume command Resume CMD is input after completing the read operation, the memory device 100 may resume the suspended program operation.

In FIG. 5, the suspend command may be a read command input during the program operation. In FIG. 6, the suspend command is a command for suspending the program operation and may be a separate command distinguished from a read command.

Figure 7:
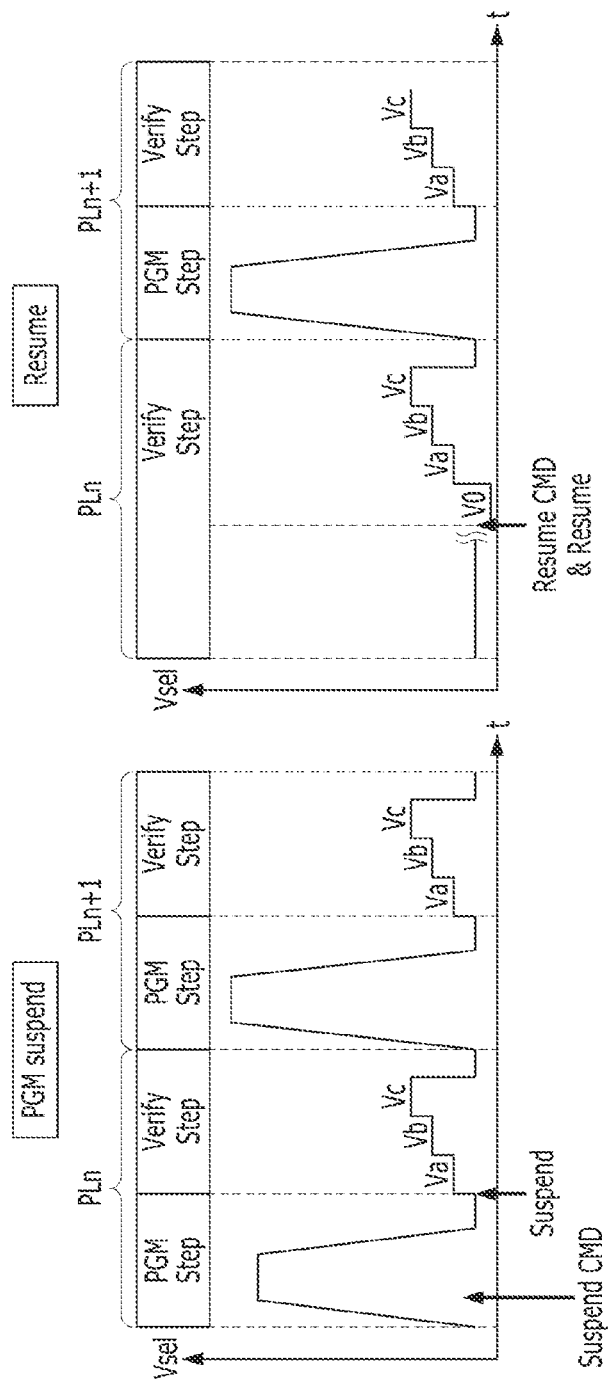
FIG. 7 is a diagram for explaining suspend and resume of a program loop executed when a suspend command is received during a program pulse application operation in accordance with an embodiment.
Figure 8:
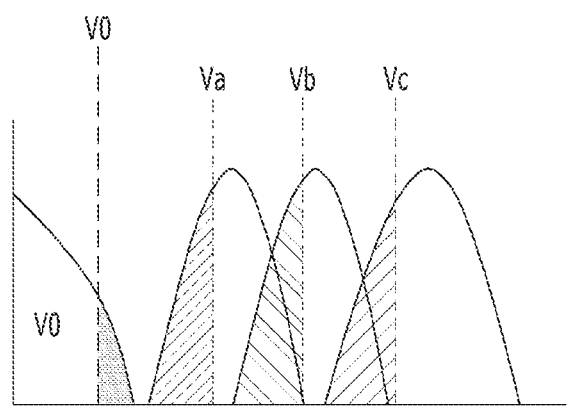
FIG. 8 is a graph illustrating a pass detection cell distribution during a negative verify operation according to FIG. 7.

FIG. 7 is a diagram for explaining suspend and resume of a program loop executed when a suspend command is received during a program pulse application operation in accordance with an embodiment, and FIG. 8 is a graph illustrating a pass detection cell distribution during a negative verify operation according to FIG. 7.

Referring to FIG. 7, a program loop PL may include a program voltage application step PGM Step in which a program pulse application operation is performed and a verify step Verify Step in which a program verify operation is performed.

Referring to the PGM suspend graph of FIG. 7, a suspend command may be input according to a selected voltage Vsel during a program pulse application operation of an $n^{th}$ program loop PLn. In such a case, after the program pulse application operation is completed, the $n^{th}$ program loop PLn may be suspended.

Thereafter, referring to the Resume graph of FIG. 7, when a resume command Resume CMD is input according to the selected voltage Vsel, a program verify operation of the $n^{th}$ program loop PLn may be resumed Resume. The program verify operation may include state verify operations corresponding to one or more program states, respectively.

In FIG. 7, because the $n^{th}$ program loop PLn is being resumed Resume, the program verify operation may include a negative verify operation Negative Verify and first to third state verify operations. In the negative verify operation, a pass state may be determined by checking the disturbance of a pass detection distribution by detecting the cell distribution greater than a threshold voltage (corresponding to the right side of the cell distribution) by using a negative voltage V0 having a voltage lower than a voltage after the completion of a program operation. That is, an operation for detecting erase cell disturbance may be performed.

In such a case, as illustrated in FIG. 8, pass bit detection and counting may be performed through a current sensing operation according to the negative voltage V0.

The first state verify operation may be an operation for verifying whether selected memory cells have been programmed to a first program state, by using a first verify voltage VA. The second state verify operation may be an operation for verifying whether the selected memory cells have been programmed to a second program state, by using a second verify voltage Vb. The third state verify operation may be an operation for verifying whether the selected memory cells have been programmed to a third program state, by using a third verify voltage Vc.

The number of state verify operations included in the program verify operation is not limited to the present embodiment. In other words, the number of program states to be verified in the program verify operation is not limited to the present embodiment. The number of verify voltages and the level of the verify voltage may vary according to the count of the program loop.

When the program verify operation of the $n^{th}$ program loop PLn is completed, an $n+1^{th}$ program loop PLn+1 may be executed. In a program pulse application operation of the $n+1^{th}$ program loop PLn+1, a program voltage higher than that in the nth program loop PLn may be applied by an incremental step pulse programming (ISPP) method. The program pulse application of the $n+1^{th}$ program loop PLn+1 may be performed without the negative verify operation Negative Verify.

Figure 9:
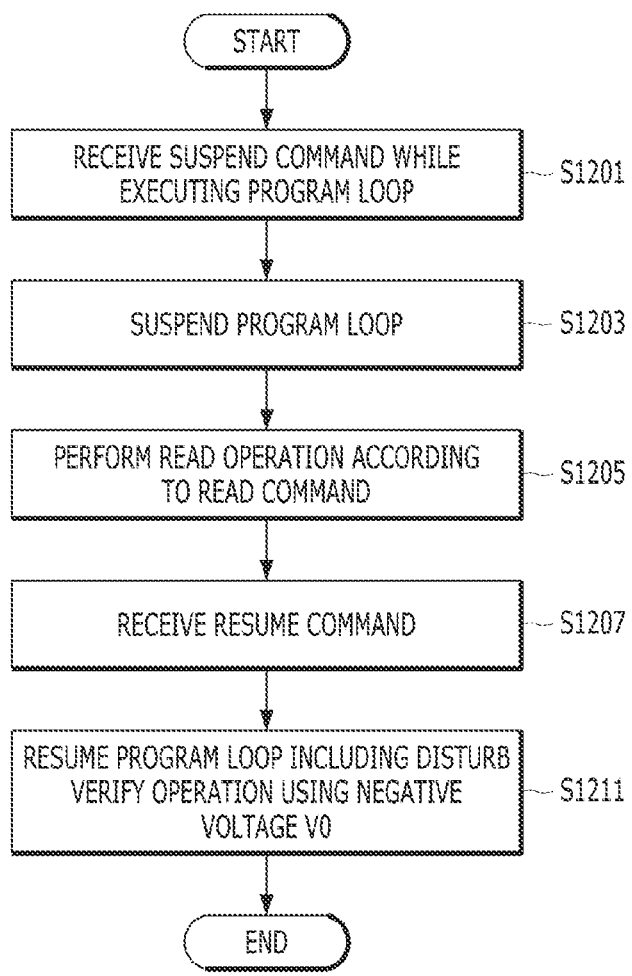
FIG. 9 is a flowchart for explaining an operation of a memory device in accordance with an embodiment illustrated in FIG. 7.

FIG. 9 is a flowchart for explaining an operation of the memory device in accordance with an embodiment.

Referring to FIG. 9, in step S1201, the memory device may receive a suspend command while executing a program loop.

In step S1203, the memory device may suspend the program loop.

In step S1205, the memory device may perform a read operation according to a read command. In an embodiment, the read command may be a separate command received after the suspend command. In another embodiment, the read command may be a suspend command received while executing a program loop.

In step S1207, the memory device may receive a resume command Resume CMD.

In step S1211, the memory device may resume the suspended program loop.

That is, a negative verify operation Negative Verify and first to third state verify operations may be performed according to the resume command. In the negative verify operation, a pass state may be determined by checking the disturbance by detecting the cell distribution greater than a threshold voltage (corresponding to the right side of the cell distribution) by using the negative voltage V0 having a voltage lower than a voltage after the program operation is completed. In such a case, the negative voltage V0 may be lower than the first verify voltage VA.

The first state verify operation may be an operation for verifying whether selected memory cells have been programmed to the first program state, by using the first verify voltage VA. The second state verify operation may be an operation for verifying whether the selected memory cells have been programmed to the second program state, by using the second verify voltage Vb. The third state verify operation may be an operation for verifying whether the selected memory cells have been programmed to the third program state, by using the third verify voltage Vc.

In accordance with an embodiment of the present disclosure, when a suspend command is received while a program loop is being executed, the program loop is not suspended after the program loop is completed. Therefore, in an embodiment, read latency can be secured in the read operation performed in step S1205.

Figure 10:
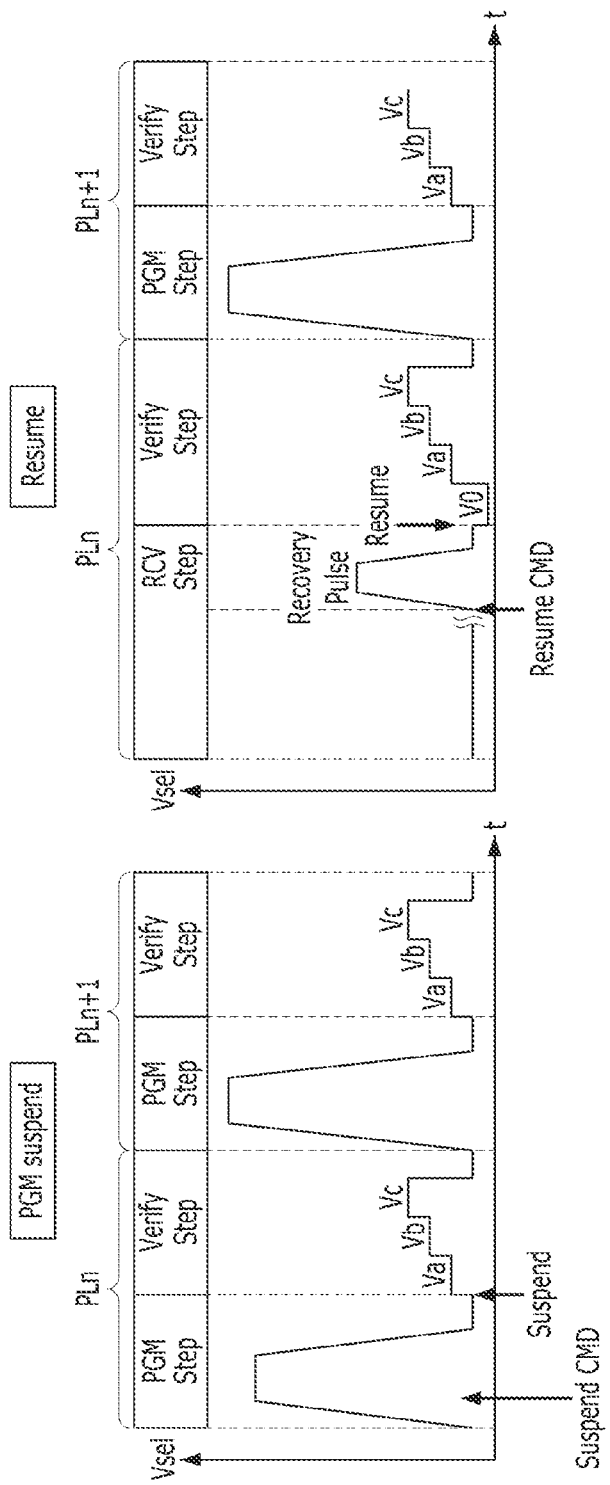
FIG. 10 is a diagram for explaining the addition of a recovery pulse application operation performed when the program loop of FIG. 7 is resumed.

FIG. 10 is a diagram for explaining the addition of a recovery pulse application operation performed when the program loop of FIG. 7 is resumed in accordance with an embodiment of the present disclosure.

Referring to FIG. 10, the suspend of a program loop may be described as in FIG. 7.

Referring to the PGM suspend graph of FIG. 10, a suspend command may be input during a program pulse application operation of an $n^{th}$ program loop PLn. In such a case, after the program pulse application operation is completed, the $n^{th}$ program loop PLn may be suspended.

Thereafter, referring to the Resume graph of FIG. 10, when a resume command is input, a recovery pulse application operation may be performed, and then a program verify operation of the $n^{th}$ program loop PLn may be resumed. The program verify operation may be described as in FIG. 7.

The recovery pulse application operation may be an operation for compensating for charges detrapped in the channel region of selected memory cells until a resume command is received after the $n^{th}$ program loop PLn is suspended. By compensating for the detrapped charges through the recovery pulse application operation, it is possible to substantially prevent or mitigate deterioration in a threshold voltage distribution of selected memory cells during a program operation in a subsequent program loop. Specifically, when charges in the channel region are detrapped, a relatively large amount of sensing current may be measured as compared to before the program loop is suspended, and a verify voltage may be increased as compared to a reference level. When the verify voltage is increased as compared to the reference level, deterioration in which the threshold voltage distribution is shifted to the right side may occur. Accordingly, in an embodiment, deterioration in the threshold voltage distribution can be substantially prevented or mitigated by compensating for the detrapped charges.

The recovery pulse application operation may be an operation for applying at least one recovery pulse to a word line connected to the selected memory cells. The level of the recovery pulse may be less than or lower than that of a program pulse applied in the program pulse application operation of a program loop. The level of the recovery pulse may be greater than or higher than that of a pass voltage applied in the program pulse application operation.

In various embodiments, the recovery pulse application operation may be an operation for applying at least one recovery pulse to bit lines connected to memory strings including the selected memory cells. In such a case, the level of the recovery pulse may be lower than or less than a ground voltage.

Figure 11:
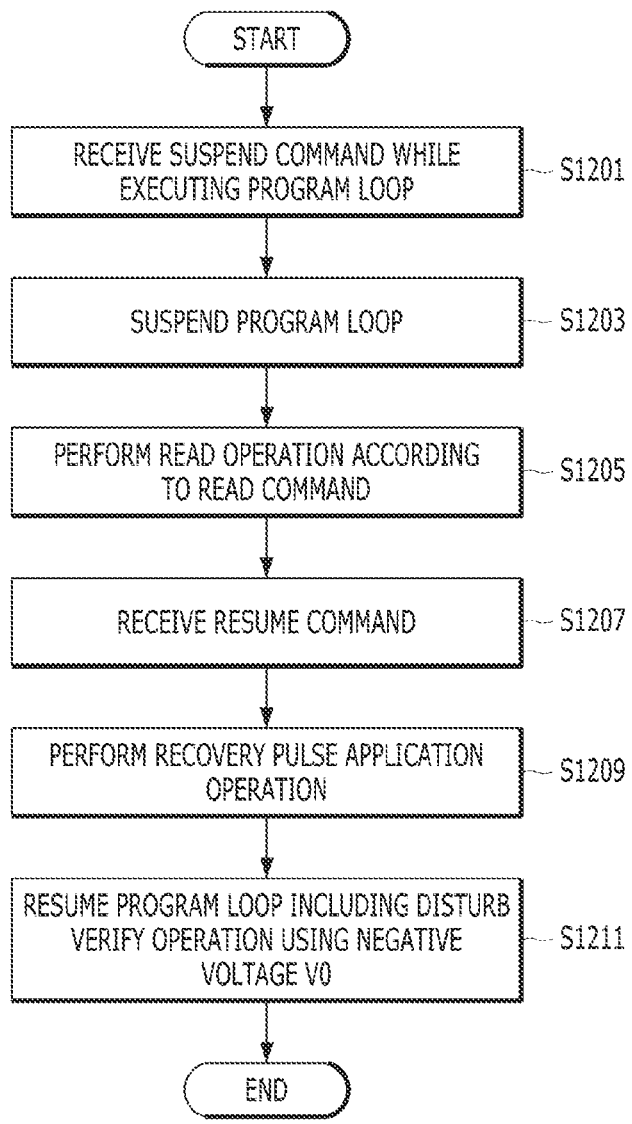
FIG. 11 is a flowchart for explaining an operation of a memory device in accordance with an embodiment illustrated in FIG. 10.

FIG. 11 is a flowchart for explaining an operation of the memory device in accordance with the embodiment illustrated in FIG. 10.

Referring to FIG. 11, in step S1201, the memory device may receive a suspend command while executing a program loop.

In step S1203, the memory device may suspend the program loop. In accordance with an embodiment of the present disclosure, when a suspend command is received while a program loop is being executed, the program loop is not suspended after the program loop is completed.

In step S1205, the memory device may perform a read operation according to a read command. In an embodiment, the read command may be a separate command received after the suspend command. In another embodiment, the read command may be a suspend command received while executing a program loop.

In step S1207, the memory device may receive a resume command Resume CMD.

In step S1209, the memory device may perform a recovery pulse application operation. The recovery pulse application operation may be an operation for compensating for charges detrapped in the channel region of selected memory cells until the resume command is received in step S1207 after the program loop is suspended in step S1203.

In step S1211, the memory device may resume the suspended program loop.

In such a case, a negative verify operation Negative Verify and first to third state verify operations may be performed according to the resume command. In the negative verify operation, a pass state may be determined by checking the disturbance by detecting the a cell distribution greater than a threshold voltage by using the negative voltage V0 having a voltage lower than a state voltage (i.e., first verify voltage Va, second verify voltage Vb, or third verify voltage Vc) at the time of application of the resume command.

The first state verify operation may be an operation for verifying whether selected memory cells have been programmed to the first program state, by using the first verify voltage Va. The second state verify operation may be an operation for verifying whether the selected memory cells have been programmed to the second program state, by using the second verify voltage Vb. The third state verify operation may be an operation for verifying whether the selected memory cells have been programmed to the third program state, by using the third verify voltage Vc.

In accordance with an embodiment of the present disclosure, when a suspend command is received while a program loop is being executed, the program loop is not suspended after the program loop is completed. Therefore, in an embodiment, read latency can be secured in the read operation performed in step S1205.

In accordance with an embodiment of the present disclosure, when a resume command is received, a program loop is resumed immediately from the point when the program loop has been suspended, instead of repeating again substantially the same program loop from the beginning, which makes it possible to save time.

In accordance with an embodiment of the present disclosure, a recovery pulse application operation is performed after a resume command is received, which makes it possible to substantially prevent or mitigate deterioration in a threshold voltage distribution caused by a waiting time from the suspend to the resume of a program loop.

In accordance with an embodiment of the present disclosure, a pass state may be determined by checking the disturbance of a pass detection distribution by detecting a cell distribution greater than threshold voltage (corresponding to the right side of the cell distribution) by using a negative voltage V0 having a voltage lower than a state voltage at the time of reception of a resume command. In such a case, pass bit detection and counting may be performed through a current sensing operation according to the negative voltage V0.

Although the technical spirit of the present disclosure has been specifically described according to the above preferred embodiment, it should be noted that the above embodiment is for explanation, not for its limitation. Furthermore, those who skilled in the art will understand that various embodiments can be made within the scope of the technical spirit of the present disclosure.

What is claimed is:

1. A memory device comprising:
a plurality of memory cells;
a peripheral circuit configured to perform a plurality of program loops on selected memory cells among the plurality of memory cells, each of the plurality of program loops including a program pulse application operation and a program verify operation; and
control logic configured to control the peripheral circuit to suspend an $n^{th}$ program loop (n is a natural number equal to or greater than 1) among the plurality of program loops in response to a suspend command received during the $n^{th}$ program loop, and to resume the $n^{th}$ program loop with a negative verify operation after performing a recovery pulse application operation, in response to a resume command,
wherein in the negative verify operation, a negative voltage having a voltage lower than a verify voltage is applied to a selected word line connected to the selected memory cells at the time of reception of the resume command.

2. The memory device of claim 1, wherein, in the negative verify operation, a pass state is determined by checking erase cell disturb by detecting a cell distribution greater than a threshold voltage by using the negative voltage.

3. The memory device of claim 2, wherein, in determining the pass state, pass bit detection and counting are performed through a current sensing operation according to the negative voltage.

4. The memory device of claim 1, wherein, in the recovery pulse application operation, at least one recovery pulse is applied to the selected word line connected to the selected memory cells.

5. An operating method of a memory device including a plurality of memory cells, the operating method comprising:
suspending an $n^{th}$ program loop (n is a natural number equal to or greater than 1) among a plurality of program loops for selected memory cells among the plurality of memory cells in response to a suspend command received during the $n^{th}$ program loop; and resuming the $n^{th}$ program loop with a negative verify operation in response to a resume command, wherein in the negative verify operation, a negative voltage having a voltage lower than a verify voltage is applied to a selected word line connected to the selected memory cells at the time of reception of the resume command, wherein the suspending of the $n^{th}$ program loop comprises:

receiving the suspend command during a program verify operation of the $n^{th}$ program loop; and suspending the $n^{th}$ program loop after completing a state verify operation being performed among state verify operations for one or more program states included in the program verify operation.

6. The operating method of claim 5, wherein, in the negative verify operation, a pass state is determined by checking erase cell disturb by detecting a cell distribution greater than a threshold voltage by using the negative voltage.

7. The operating method of claim 6, wherein, in determining the pass state, pass bit detection and counting are performed through a current sensing operation according to the negative voltage.

8. The operating method of claim 5, wherein the suspending of the $n^{th}$ program loop comprises:

receiving the suspend command during a program pulse application operation of the $n^{th}$ program loop; and suspending the $n^{th}$ program loop after the program pulse application operation is completed.

9. The operating method of claim 8, wherein, in the resuming of the $n^{th}$ program loop, a program verify operation of the $n^{th}$ program loop is resumed.

10. The operating method of claim 5, wherein, in the resuming of the $n^{th}$ program loop, an uncompleted state verify operation among the state verify operations for the one or more program states is resumed.

11. The operating method of claim 5, further comprising:

a recovery pulse application operation for applying at least one recovery pulse to the selected word line connected to the selected memory cells when the resume command is applied.

12. The operating method of claim 11, wherein a level of the at least one recovery pulse is lower than a level of a program pulse applied to the selected word line and is greater than or equal to a level of a pass voltage applied to an unselected word line in a program pulse application operation.

* * * * *